United States Patent
Koike (10) Patent No.: US 7,639,043 B2
(45) Date of Patent: Dec. 29, 2009

(54) LVDS RECEIVER CIRCUIT

(75) Inventor: Hideharu Koike, Yokohama (JP)

(73) Assignee: Winbond Electronics Corp., Hsinchu (TW)

( * ) Notice: Subject to any disclaimer, the term of this patent is extended or adjusted under 35 U.S.C. 154(b) by 0 days.

(21) Appl. No.: 11/868,047

(22) Filed: Oct. 5, 2007

(65) Prior Publication Data

US 2009/0091389 A1   Apr. 9, 2009

(51) Int. Cl.
  *H03K 19/094* (2006.01)
(52) U.S. Cl. .............. 326/82; 326/83; 327/66; 327/67; 327/109
(58) Field of Classification Search ............. 326/82–83; 327/66–67, 108–109
  See application file for complete search history.

(56) References Cited

U.S. PATENT DOCUMENTS

| | | | |
|---|---|---|---|
| 5,666,068 A * | 9/1997 | Ehmann | 326/63 |
| 5,764,086 A | 6/1998 | Nagamatsu et al. | |
| 6,452,429 B1 | 9/2002 | Lim | |
| 6,512,400 B1 * | 1/2003 | Forbes | 327/66 |
| 6,788,142 B2 | 9/2004 | Li et al. | |
| 6,879,198 B2 * | 4/2005 | Kumar et al. | 327/206 |
| 7,199,638 B2 * | 4/2007 | Dubey et al. | 327/333 |

OTHER PUBLICATIONS

"Delay and an Inter-Bank Shared Redudancy Scheme"; Digest Of Technical Papers; pp. 418-419 and 487 (1999 IEEE International Solid-State Circuits Conference).

* cited by examiner

*Primary Examiner*—Vibol Tan
*Assistant Examiner*—Jason Crawford
(74) *Attorney, Agent, or Firm*—Connolly Bove Lodge & Hutz LLP (57) ABSTRACT

The LVDS receiver circuit comprises a differential-input transistor pair, a control transistor pair, a current-mirror-load circuit, a first feedback inverter and a second feedback inverter. The first feedback inverter, the second feedback inverter and the control transistor pair constitute a feedback loop. The voltage change of the input voltage of the first feedback inverter is suppressed, and the input voltage is controlled around the threshold voltage of the first feedback inverter.

24 Claims, 9 Drawing Sheets

LVDS RECEIVER CIRCUIT

BACKGROUND OF THE INVENTION

1. Field of the Invention

The present invention relates to a low-voltage differential signaling (LVDS) receiver circuit, and more particularly to an LVDS receiver circuit which has a simple structure but is still able to obtain a large voltage gain.

2. Description of the Related Art

LVDS technology is commonly used to provide a low-power and low-voltage alternative to other high-speed I/O interfaces, specifically for point-to-point transmissions, such as those used in network devices within data and communication networks. It is common practice that LVDS is implemented in ICs to overcome some deficiencies with previous I/O interface circuitry. As the input differential voltage of the LVDS receiver is very small (about 100 mV to 200 mV), and the switching speed of the input signal is very high (greater than 400 MHz), some of issues need to be considered when an LVDS receiver is being made. First, the circuit needs enough voltage gain. Second, the circuit needs to convert a differential output voltage to a single output voltage. Third, the circuit needs to convert a single output voltage to a normal logic level. Fourth, in order to enhance the switching speed, the amplifier circuit should be simple. Fifth, in order to work with the wide ranges of input voltage and supply voltage, the dynamic range of the amplifier should be kept large. Sixth, in order to implement the circuit with a normal CMOS process, the circuit should be robust enough to withstand the process variation and should not require any special process, such as low VTH transistor or high-resistance polysilicon.

Figure 1:
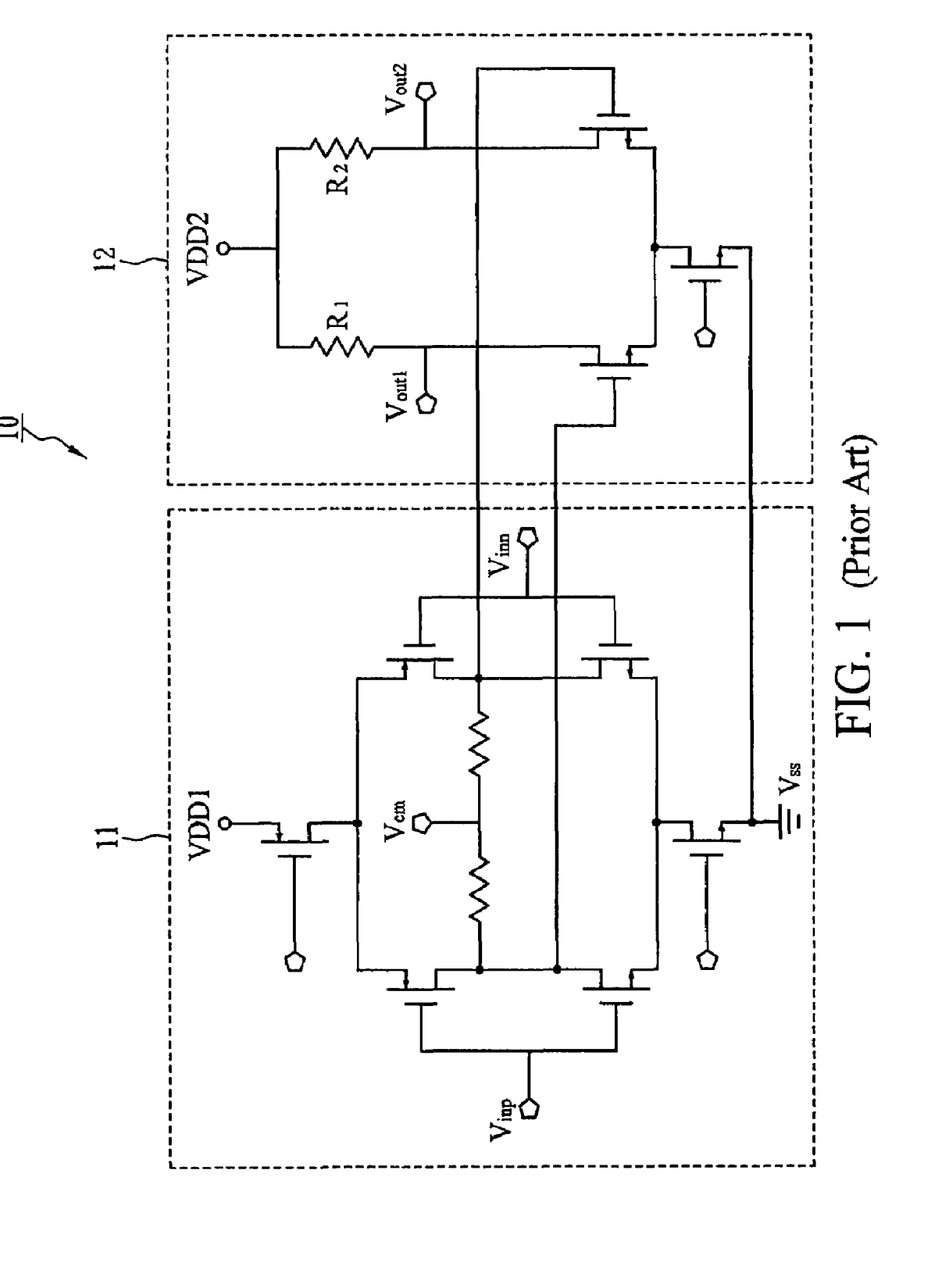
FIG. 1 shows a prior art circuit.

As shown in FIG. 1, U.S. Pat. No. 6,788,142 discloses a wide input range amplifier circuit 10, which includes a pre-amplifier stage 11 and a current mode logic stage 12. VDD1 is a 2.5-volt I/O voltage, VDD2 is a 1.2-volt core voltage used for the digital core, and Vcm is ideally set to VDD1/2. Although the prior art circuit 10 satisfies the first requirement, it does not satisfy the other requirements, especially the second one.

Figure 2:
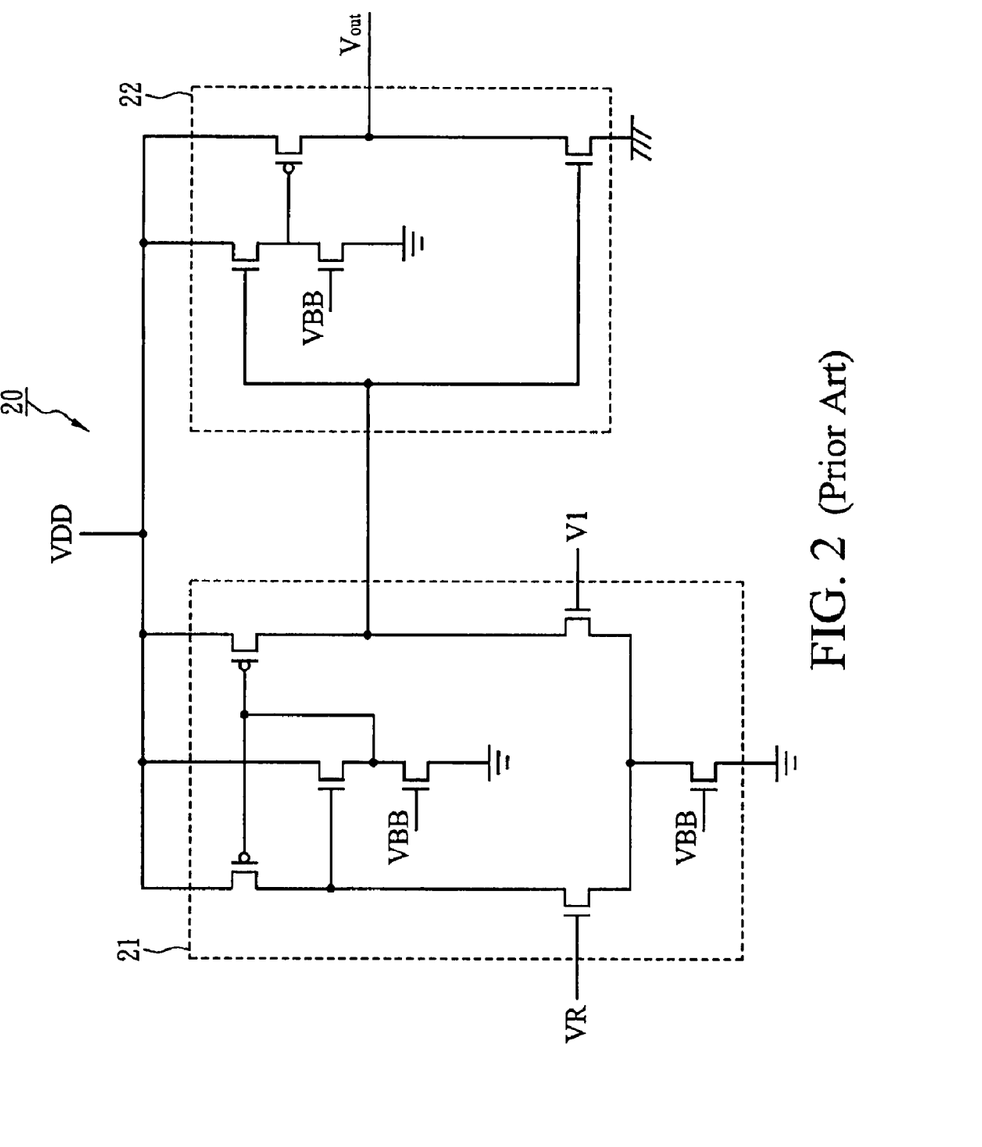
FIG. 2 shows another prior art circuit.

As shown in FIG. 2, U.S. Pat. No. 6,512,400 discloses a comparator 20, which includes a differential amplifier 21 and an output inverter amplifier 22. Although the prior art comparator 20 satisfies the second requirement, it needs an additional bias voltage VBB, which cannot be easily made to work for all the input voltage range and process variations.

U.S. Pat. No. 5,764,086 discloses a circuit having a wide common mode range and a large voltage gain, but that circuit is too complicated to implement. In addition, its speed is too low. Y. Takai, et al., entitled "A 250 Mb/s/pin 1 Gb Double Data Rate SDRAM with a Bi-Directional Delay and an Inter-Bank Shared Redundancy Scheme," NEC Corp. ISSCC99 WP24.5, pp. 418-419, discloses a circuit having a wide common-mode voltage range, but that gain and its speed is not good enough. U.S. Pat. No. 6,452,429 discloses a circuit having a wide common-mode voltage range and does not require any reference voltage, but that gain and its speed is still not good enough Though an LVDS receiver can be implemented by combining those two circuits in series, the combined circuit is so complicated that its speed, stability and dynamic range still do not satisfy the above requirements.

SUMMARY OF THE INVENTION

The LVDS receiver circuit of one embodiment of the present invention comprises a differential-input transistor pair, a control transistor pair, a current-mirror-load circuit, a first feedback inverter and a second feedback inverter. The differential-input transistor pair has a gate-terminal pair for receiving differential input voltage. The control transistor pair has at least one terminal pair connected to one terminal pair of the differential-input transistor pair. The current-mirror-load circuit has one terminal pair connected to a common terminal pair of the differential-input transistor pair and control transistor pair. The reference current input terminal of the current mirror-load circuit is connected to a first common terminal of the common terminal pair. The voltage output terminal of the current mirror circuit is connected to a second common terminal of the common terminal pair. A first input voltage of the differential input voltage is applied to the gate of the first input transistor of the differential input transistor pair, and a second input voltage of the differential input voltage is applied to the gate of the second input transistor of the differential input transistor pair. The first input transistor is connected to the first common terminal of the common terminal pair, and the second input transistor is connected to the second common terminal of the common terminal pair. The first feedback inverter has a gate terminal and an output terminal, where the gate terminal connects to the second common terminal, and the output terminal connects to the gate of the control transistor connected to the first common terminal. The second feedback inverter has a gate terminal and an output terminal, where the gate terminal connects to the output terminal of the first feedback inverter, and the output terminal connects to the gate of the control transistor connected to the second common terminal.

The LVDS receiver circuit of another embodiment of the present invention comprises a differential-input transistor pair, a current-mirror-load circuit, a first feedback inverter and a second feedback inverter. The differential-input transistor pair has a gate-terminal pair for receiving differential input voltage. The current-mirror-load circuit has one terminal pair connected to one terminal pair of the differential-input transistor pair. The reference current input terminal of the current mirror-load circuit is connected to a first common terminal of the common terminal pair. The voltage output terminal of the current mirror circuit is connected to a second common terminal of the common terminal pair. A first input voltage of the differential input voltage is applied to the gate of the first input transistor of the differential input transistor pair, and a second input voltage of the differential input voltage is applied to the gate of the second input transistor of the differential input transistor pair. The first input transistor is connected to the first terminal of the common terminal pair, and the second input transistor is connected to the second common terminal of the common terminal pair. The first feedback inverter has a gate terminal and an output terminal, where the gate terminal connects to the second common terminal of the common terminal pair. The second feedback inverter has a gate terminal and an output terminal, where the gate terminal connects to the output terminal of the first feedback inverter, and the output terminal connects to the first common terminal of the common terminal pair.

The LVDS receiver circuit of another embodiment of the present invention comprises a differential-input transistor pair, a current-mirror-load circuit, a feedback buffer and a feedback inverter. The differential-input transistor pair has a gate-terminal pair for receiving differential input voltage. The current-mirror-load circuit has one terminal pair connected to one terminal pair of the differential-input transistor pair. The reference current input terminal of the current mirror-load circuit is connected to a first common terminal of the common terminal pair. The voltage output terminal of the current mirror circuit is connected to a second common terminal of the common terminal pair. A first input voltage of the differential input voltage is applied to the gate of the first input transistor of the differential input transistor pair, and a second input voltage of the differential input voltage is applied to the gate of the second input transistor of the differential input transistor pair. The first input transistor is connected to the first common terminal of the common terminal pair, and the second input transistor is connected to the second common terminal of the common terminal pair. The feedback buffer has a gate terminal and an output terminal, where the gate terminal connects to the second common terminal of the common terminal pair. The feedback inverter has a gate terminal and an output terminal, where the gate terminal connects to the output terminal of the feedback buffer, and the output terminal connects to the second common terminal of the common terminal pair.

The LVDS receiver circuit of another embodiment of the present invention comprises an input inverter pair, a current-mirror load circuit, a first buffer inverter and a first feedback inverter. The input inverter pair and the current-mirror circuit are connected to a common terminal pair. The input inverter pair has an input-terminal pair for receiving differential input voltage. A reference current input terminal of the current mirror-load circuit is connected to a first common terminal of the common terminal pair. A voltage output terminal of the current mirror circuit is connected to a second common terminal of the common terminal pair. A first input voltage of the differential input voltage is applied to the input of the first input inverter of the input inverter pair, and a second input voltage of the differential input voltage is applied to the input of the second input inverter of the input inverter pair. The output of the first input inverter is connected to the first common terminal of the common terminal pair, and the output of the second input inverter is connected to the second common terminal of the common terminal pair. The input of the first feedback inverter is connected to the output of the first buffer inverter and the output terminal of the first feedback inverter is connected to the first common terminal of the common terminal pair.

The LVDS receiver circuit of another embodiment of the present invention comprises an input inverter pair, a current-mirror load circuit, a first buffer inverter, a second buffer and a feedback inverter. The input inverter pair and the current mirror load circuit is connected a common terminal pair. The input inverter pair has an input-terminal pair for receiving differential input voltage. A reference current input terminal of the current mirror-load circuit is connected to a first common terminal of the common terminal pair. A voltage output terminal of the current mirror circuit is connected to a second common terminal of the common terminal pair. A first input voltage of the differential input voltage is applied to the input of the first input inverter of the input inverter pair, and a second input voltage of the differential input voltage is applied to the input of the second input inverter of the input inverter pair. The output of the first input inverter is connected to the first common terminal of the common terminal pair, and the output of the second input inverter is connected to the second common terminal of the common terminal pair. The first buffer inverter is connected to the second common terminal. The input of the second buffer inverter is connected to the output of the first buffer inverter. The input of the feedback inverter is connected to the output of the second buffer inverter and the output terminal of the feedback inverter is connected to the second common terminal.

BRIEF DESCRIPTION OF THE DRAWINGS

The invention will be described according to the appended drawings in which.

PREFERRED EMBODIMENT OF THE PRESENT INVENTION

Figure 3:
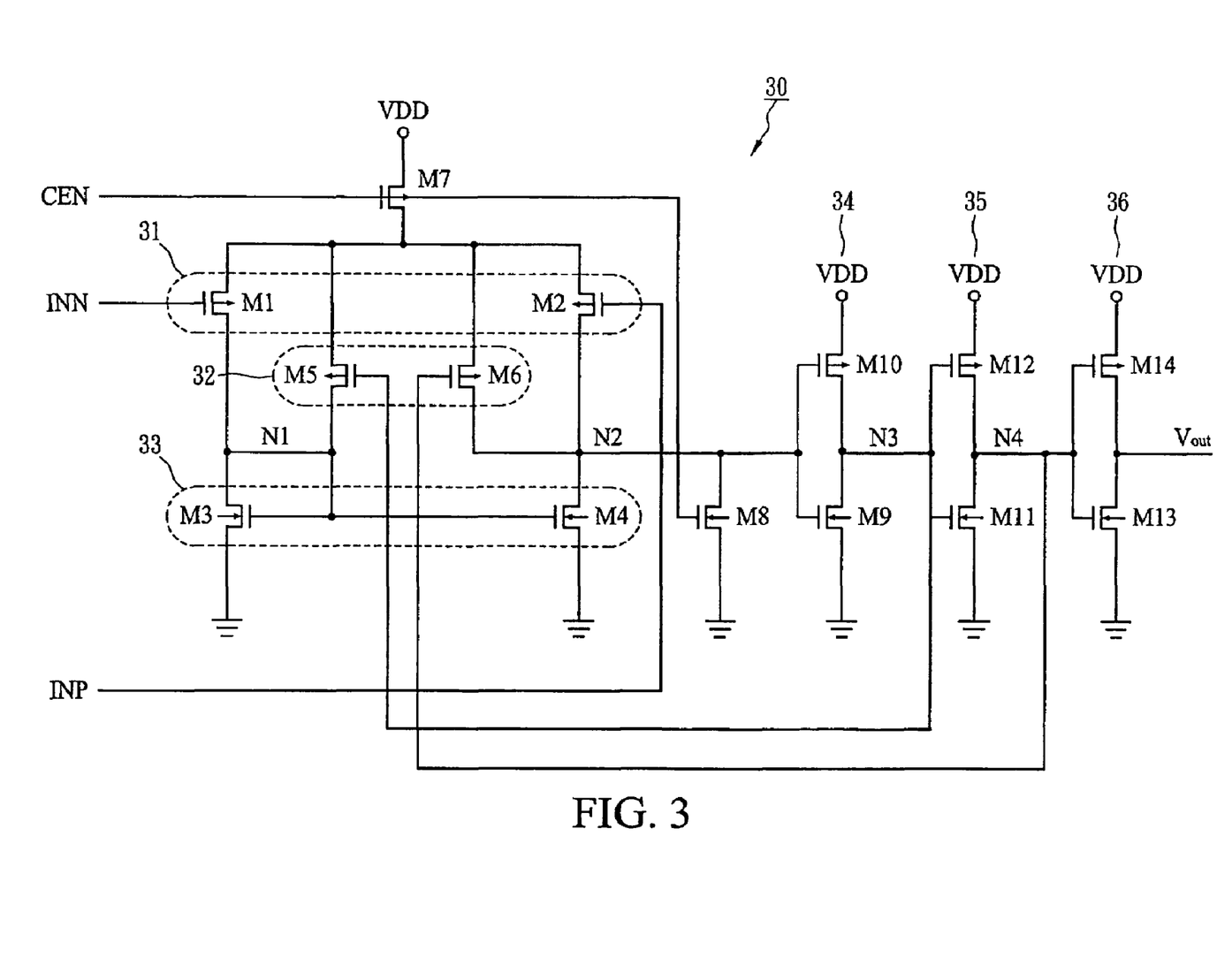
FIG. 3 shows an LVDS receiver circuit in accordance with a first embodiment of the present invention.

FIG. 3 shows an LVDS receiver circuit in accordance with a first embodiment of the present invention. The LVDS receiver circuit 30 comprises a differential-input transistor pair 31, a control transistor pair 32, a current-mirror-load circuit 33, a first feedback inverter 34 and a second feedback inverter 35. The differential-input transistor pair 31 includes a first input transistor M1 and a second input transistor M2, which have gate terminals for receiving a differential input voltage. The control transistor pair 32, which is connected to the differential-input transistor pair 31 in a parallel manner, includes a first control transistor M5 and a second control transistor M6. The current-mirror-load circuit 33 includes transistors M3 and M4, and has one terminal pair N1 and N2 connected to a common terminal pair of the differential-input transistor pair 31 and control transistor pair 32. The current mirror load circuit 33 has a reference current input terminal (N1) and a voltage output terminal (N2). The reference current input terminal is connected to the first common terminal of the common terminal pair, and the voltage output terminal is connected to the second common terminal of the common terminal pair. The current-mirror-load circuit 33 converts a differential current flow in transistors M3 and M4 to a single output voltage at the voltage output terminal N2. Preferably, the drain-terminal pair of the differential-input transistor pair 31 and control transistor pair 32 connects to the drain-terminal pair of the current-mirror-load circuit 33. The first feedback inverter 34 is for use in amplifying the driving capability of the voltage output terminal N2, and has an input terminal and an output terminal, where the input terminal is connected to the second common terminal N2, and the output terminal N3 is connected to the gate of the first control transistor M5. The second feedback inverter 35 has an input terminal and an output terminal, where the input terminal is connected to the output terminal N3 of the first feedback inverter 34, and the output terminal N4 is connected to the gate of the second control transistor M6. By the above connection, the first feedback inverter 34 and second feedback inverter 35 will constitute a negative feedback with the control transistor pair 32. By means of the negative feedback, the voltage change at the second common terminal N2 is suppressed, and the voltage of the second common terminal N2 is controlled around the threshold voltage of the first feedback inverter 34. Optionally, there is an output inverter 36 connected to the second feedback inverter 35. Two transistors M7 and M8, both of which are controlled by a power-down control signal CEN, are added to the application in a power-down mode. The transistor M7 connects power VDD to the other terminal pair of the differential-input transistor pair 31 and control transistor pair 32 opposite the current-mirror-load circuit 33, and the transistor M8 seeks to ground the second common terminal N2, in the power-down mode. When a power-down control signal CEN is initiated, the transistor M7 is turned off and the transistor M8 is turned on, so the second common terminal N2 is pulled down to grounding level. Therefore, the output of the third inverter 36 will remain at logic high in the power-down mode.

Figure 4:
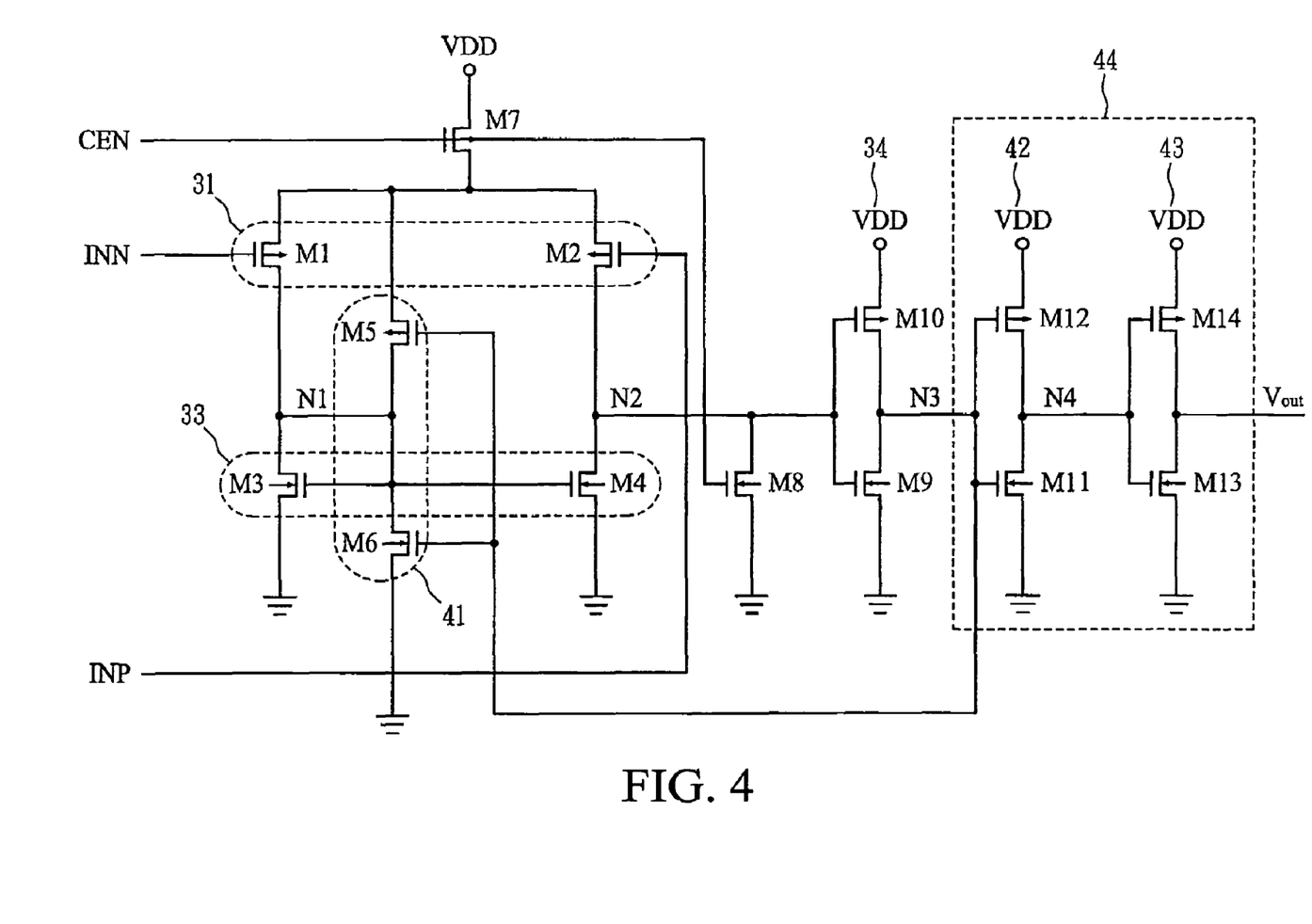
FIG. 4 shows an LVDS receiver circuit in accordance with a second embodiment of the present invention.

FIG. 4 shows an LVDS receiver circuit in accordance with a second embodiment of the present invention. This embodiment has a similar structure to that of the first embodiment but changes the arrangement of its feedback loop. A second feedback inverter 41 has an input terminal and an output terminal, where the input terminal is connected to the output terminal N3 of the first feedback inverter 34, and its output terminal is connected to the first common terminal N1 of the differential-input transistor pair 31 and current-mirror-load circuit 33. Obviously, the voltage change of the node N1 is suppressed by the negative feedback loop, which is constituted by the first feedback inverter 34 and the second feedback inverter 41. Because the node N2 and the node N1 are at opposite ends of the current-mirror-load circuit 33, the voltage change of the node N2 is also suppressed, and the voltage of the node N2 is kept at around the threshold voltage of the first feedback inverter 34. Optionally, a buffer 44 including inverters 42 and 43 is connected to the first feedback inverter 34 for outputting an output signal Vout.

Figure 5:
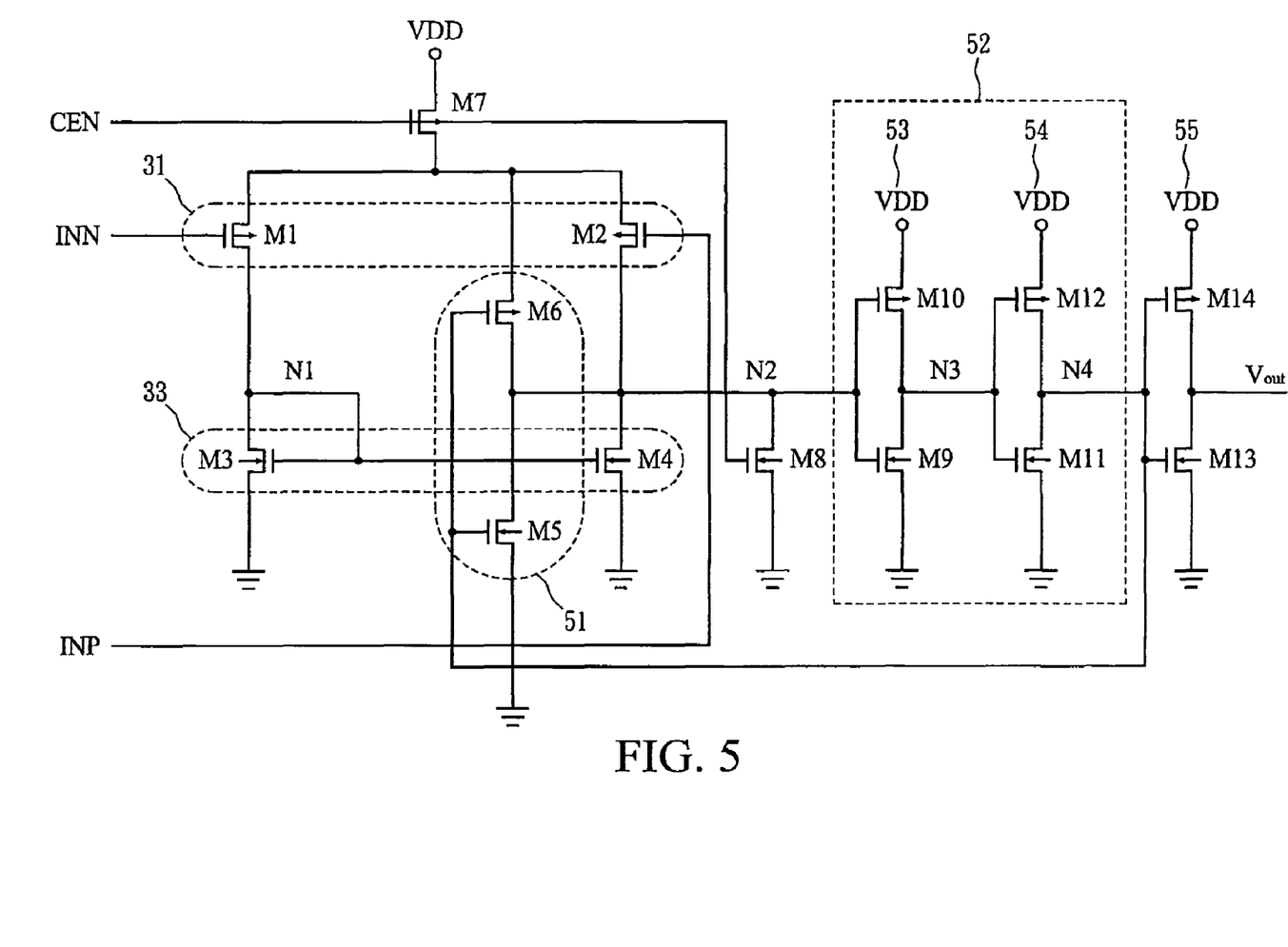
FIG. 5 shows an LVDS receiver circuit in accordance with a third embodiment of the present invention.

FIG. 5 shows an LVDS receiver circuit in accordance with a third embodiment of the present invention. This embodiment has a similar structure to that of the second embodiment but changes the arrangement of its feedback loop. A feedback inverter 51 has an input terminal and an output terminal, where the input terminal connects to the output terminal N4 of the feedback buffer 52, which includes inverters 53 and 54, and its output terminal is connected to the second common terminal N2 of the differential-input transistor pair 31 and current-mirror-load circuit 33. Obviously, the voltage change of the node N2 is suppressed by the negative feedback loop, which is constituted by the feedback buffer 52 and the feedback inverter 51, and the voltage of the node N2 is kept at around the threshold voltage of the inverter 53. Optionally, there is an inverter 55 connected to the feedback buffer 52.

Figure 6:
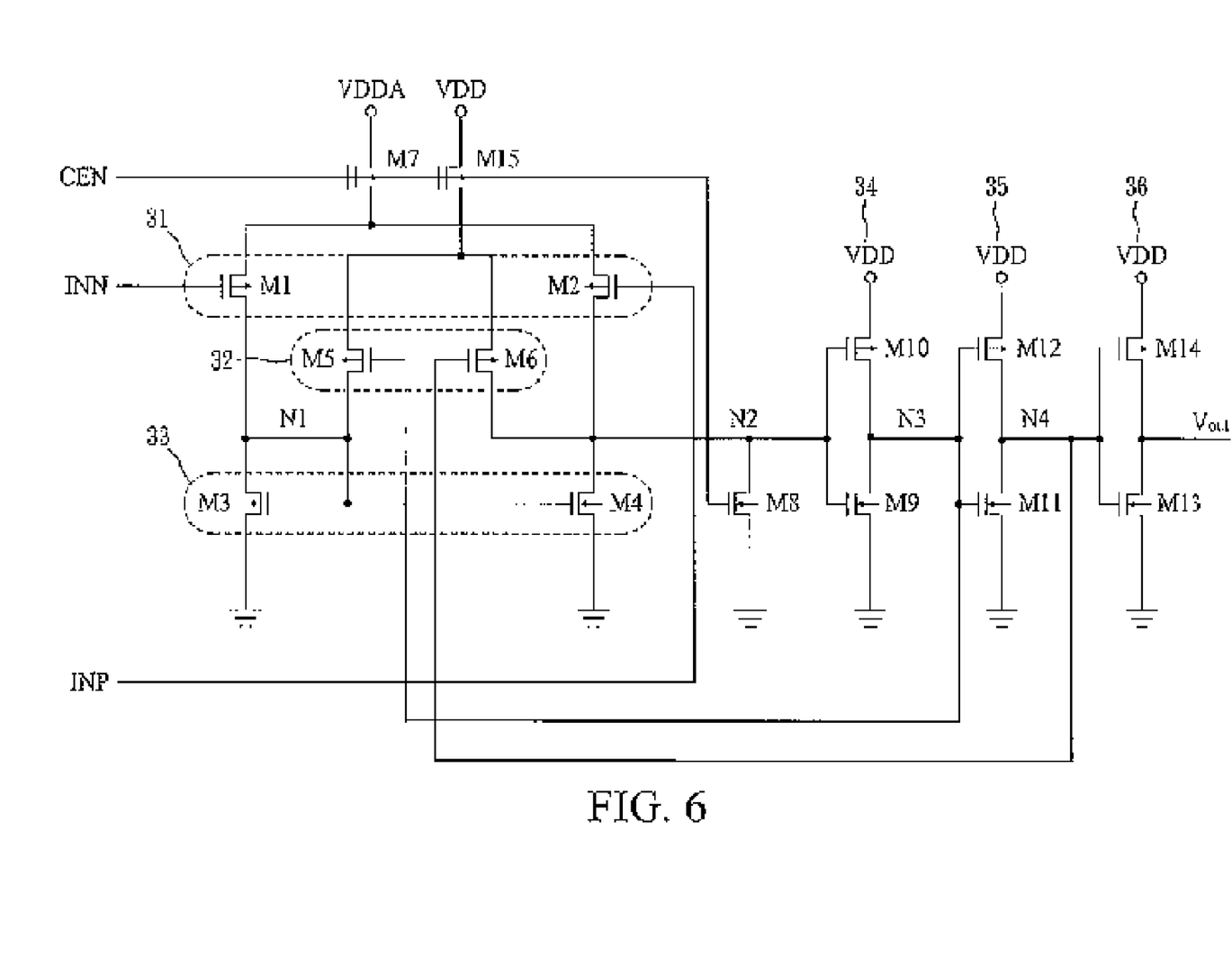
FIG. 6 shows an LVDS receiver circuit in accordance with a fourth embodiment of the present invention.

FIG. 6 shows an LVDS receiver circuit in accordance with a fourth embodiment of the present invention. This embodiment has a similar structure to that of the first embodiment but changes the arrangement in its pull-down circuit. There are two transistors M7 and M15, which connect two power supplies VDD and VDDA to the differential-input transistor pair 31 and the control transistor pair 32, respectively. The voltages of the two power supplies are not necessarily the same. As the differential-input transistor pair 31 and the control transistor pair 32 work at a different voltage range, if VDD is not equal to VDDA, the voltage gain of each transistor pair is improved. Also, because the noise of each transistor pair is isolated by the transistors M7 and M15, the S/N ratio is thus improved. In addition, in the power-down mode, the power-down control signal CEN is initiated, the transistors M7 and M15 are turned off and the transistor M8 is turned on, so the node N2 is pulled down to grounding level. Therefore, the output of the third inverter 55 will maintain at logic high in the power-down mode.

Figure 7:
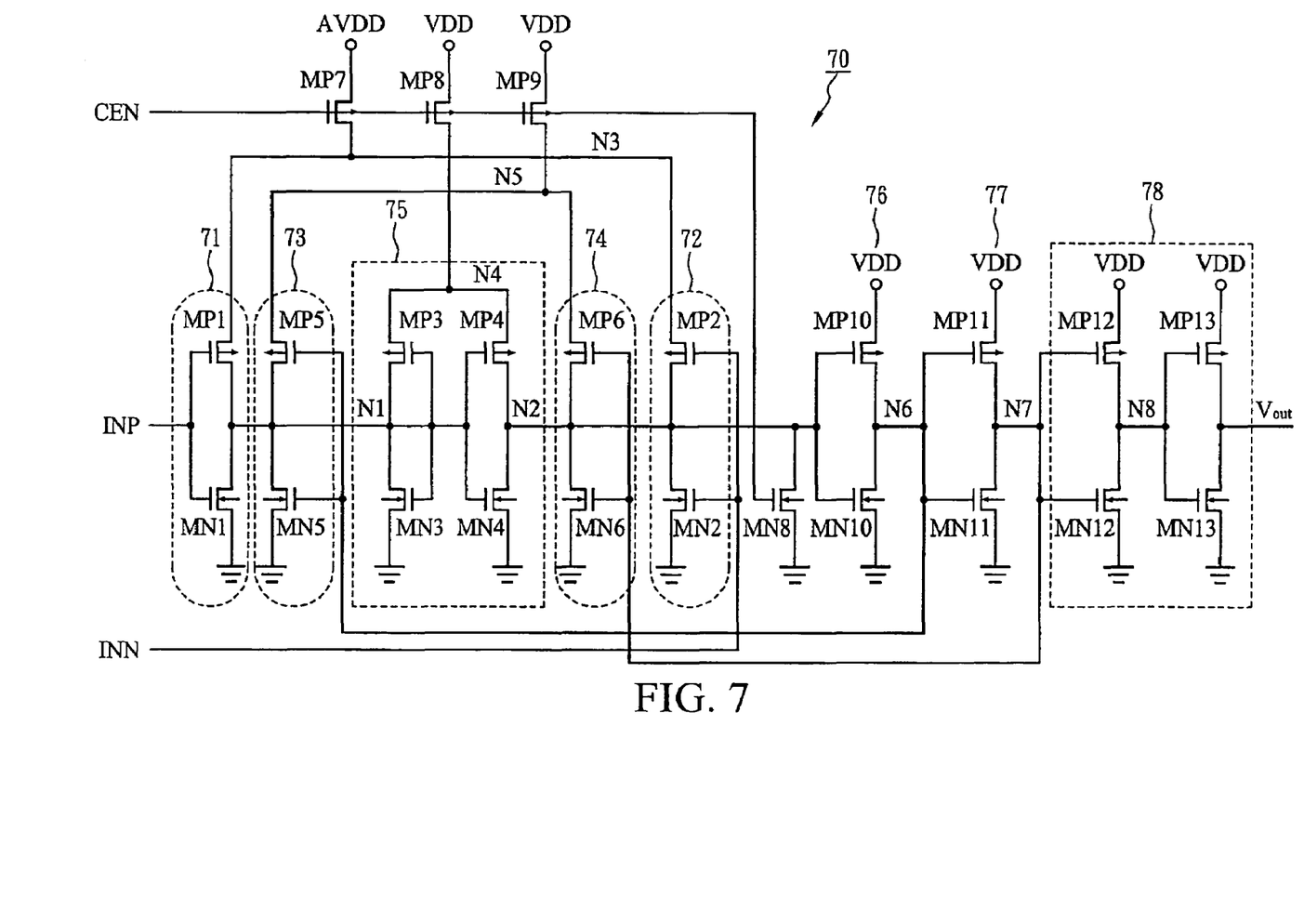
FIG. 7 shows an LVDS receiver circuit in accordance with a fifth embodiment of the present invention.

FIG. 7 shows an LVDS receiver circuit in accordance with a fifth embodiment of the present invention. The LVDS receiver circuit 70 comprises a positive-input inverter 71 of an inverter pair, a negative-input inverter 72 of the inverter pair, a current mirror circuit 75, a first feedback inverter 73, a second feedback inverter 74, a first buffer inverter 76, a second buffer inverter 77 and a buffer 78. The inverter pair transforms a differential input voltage into a differential current at the common terminals N1 and N2. The current-mirror circuit 75 includes transistors MN3, MP3, MN4 and MP4, and couples to the inverter pair through the common terminals N1 and N2. The second common terminal N2, which acts as a single-end output of the current-mirror circuit 75, drives the first buffer inverter 76, the first buffer inverter 76 drives the second buffer inverter 77, and the second buffer inverter 77 drives the buffer 78, one by one and sequentially. The output terminal N6 of the first buffer inverter 76 couples to the input of the first feedback inverter 73, and the output of the first feedback inverter 73 is coupled to the first common terminal N1. The output terminal N7 of the second buffer inverter 77 is coupled to the input of the second feedback inverter 74, and the output of the first feedback inverter 74 is coupled to the second common terminal N2. By the above connection, the first feedback inverter 73 and the second feedback inverter 74 will constitute negative feedbacks with the first buffer inverter 76 and the second buffer inverter 77, respectively. By means of the negative feedback, the voltage change of the terminals N1 and N2 is suppressed, and the voltage of the node N2 is controlled around the threshold voltage of the first buffer inverter 76. The sensitivity and the speed of the circuit 70 of this embodiment are thus improved. Optionally, the differential current of the inverter pair is designed to be larger than that of the first and second feedback inverters. Therefore, the logic state of the differential amplifier does not change and the negative feedback will not result in any oscillation. Four transistors MP7, MP8, MP9 and MN8, all of which are controlled by a power-down control signal CEN, are added to the application of a power-down mode. The transistor MP7 connects power AVDD to the transistors MP1 and MP2 of the inverter pair, the transistor MP8 connects power VDD to the transistors MP3 and MP4 of the current-mirror circuit 75, the transistor MP9 connects power VDD to the transistors MP5 and MP6 of the first and second feedback inverters 73 and 74, and the transistor MN8 seeks to ground the terminal N2 in the power-down mode. When a power-down control signal CEN is initiated, the transistors MP7, MP8 and MP9 are turned off and the transistor MN8 is turned on, so the node N2 is pulled down to grounding level. Accordingly, the output of the buffer 78 will maintain at logic low in the power-down mode. The supply voltage AVDD for the inverter pair is not necessarily the same as the power supply VDD. It is common practice that the inverter pair operates at a high voltage, and therefore the input voltages INP and INN may exceed the supply voltage VDD.

Figure 8:
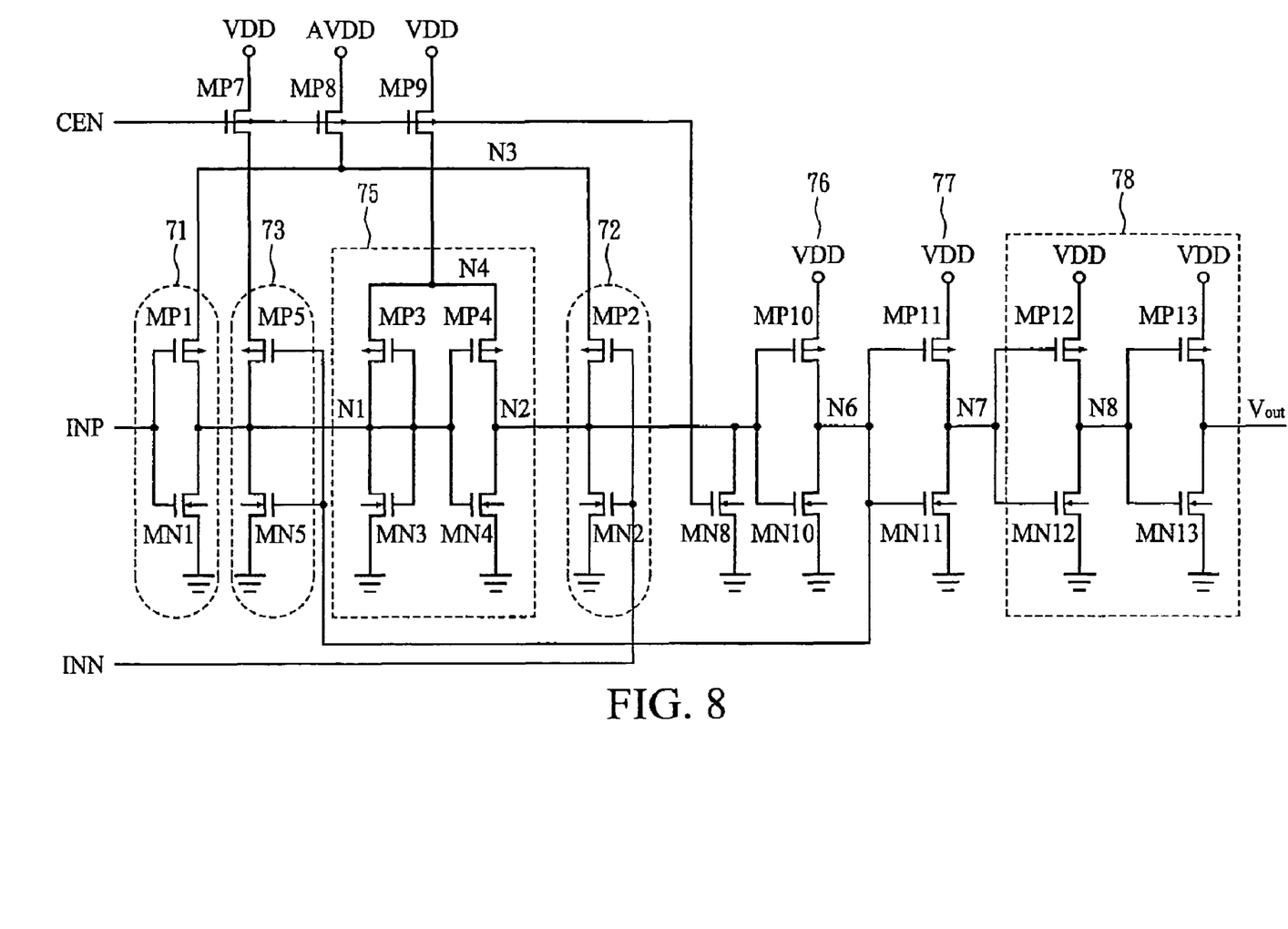
FIG. 8 shows an LVDS receiver circuit in accordance with a sixth embodiment of the present invention.

FIG. 8 shows an LVDS receiver circuit in accordance with a sixth embodiment of the present invention. The difference of the circuit in FIG. 8 from that in FIG. 7 is that the second feedback inverter 74 is removed. Therefore, compared to the circuit in FIG. 7, the terminal N2 in FIG. 8 possesses a more fluctuant voltage, which makes the switching speed of this circuit lower than that in FIG. 7. However, because the negative feedback at terminal N1 reduces the voltage fluctuation, the voltage of the terminal N2 can be controlled around the threshold voltage of the first buffer inverter 76.

Figure 9:
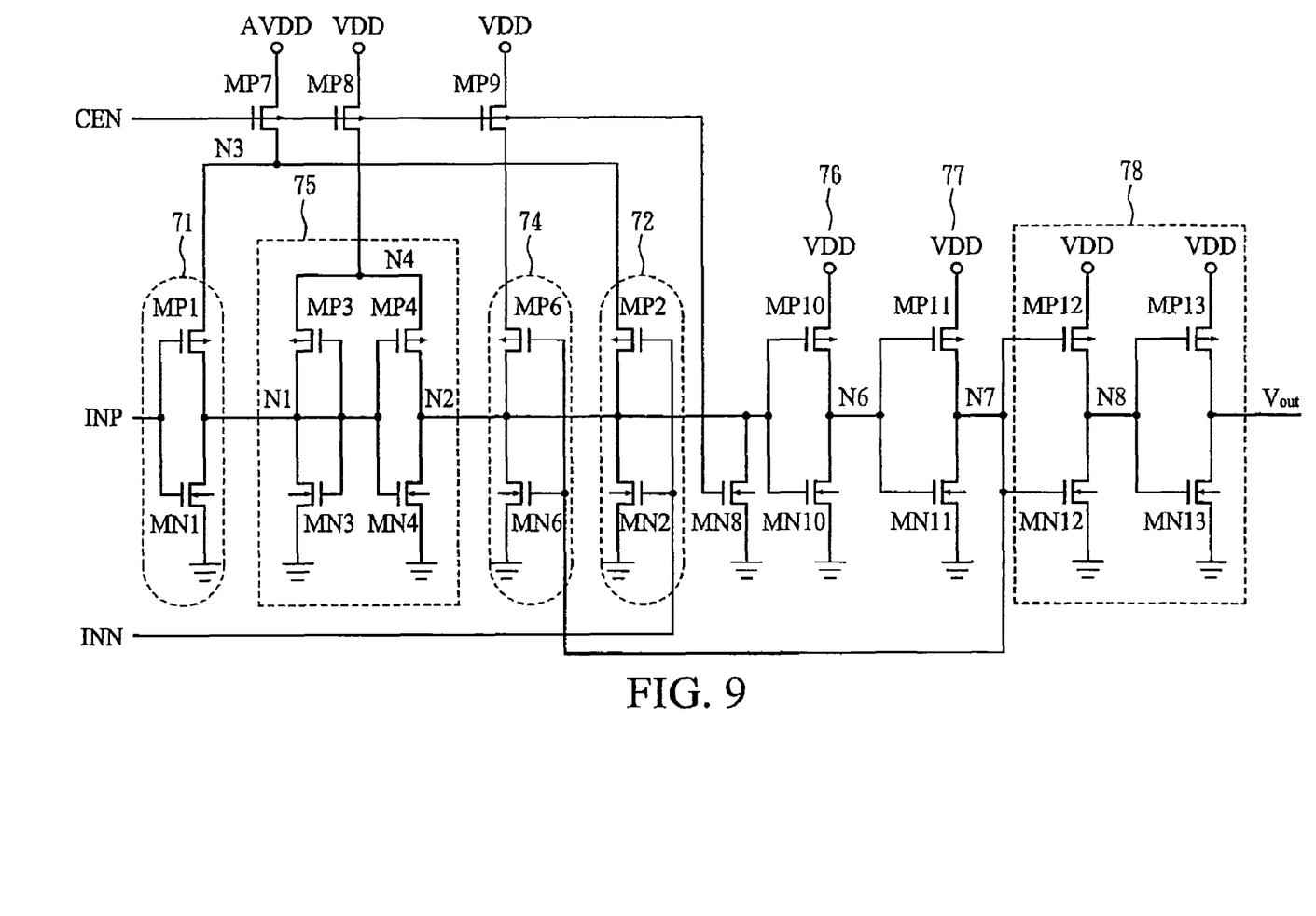
FIG. 9 shows an LVDS receiver circuit in accordance with a seventh embodiment of the present invention.

FIG. 9 shows an LVDS receiver circuit in accordance with a seventh embodiment of the present invention. The difference of the circuit in FIG. 9 from that in FIG. 7 is that the first feedback inverter 73 is removed. Therefore, compared to the circuit in FIG. 7, the terminal N1 in FIG. 9 possesses a more fluctuant voltage, which makes the switching speed of this circuit lower than that in FIG. 7. However, because the negative feedback at terminal N2 reduces the voltage fluctuation, the voltage of the terminal N2 can be controlled around the threshold voltage of the first buffer inverter 76.

The above embodiments of the present invention do not need a two-stage or multi-stage amplifier to obtain a large voltage gain, so the delay time is short. Also, the area required by the above embodiments is smaller than prior art, and the speed of the above embodiments is greater than prior art due to its simple structure. In addition, the above embodiments do not need any special process nor a bias voltage, which is usually found in prior art circuits.

The above-described embodiments of the present invention are intended to be illustrative only. Numerous alternative embodiments may be devised by persons skilled in the art without departing from the scope of the following claims.

What is claimed is:

1. A low-voltage differential signaling (LVDS) receiver circuit, comprising:
   a common terminal pair having a first common terminal and a second common terminal;
   a differential-input transistor pair having a gate-terminal pair for receiving a differential input voltage and one terminal pair connected to the common terminal pair, wherein the differential-input transistor pair includes first and second input transistors, the first input transistor is connected to the first common terminal and the second input transistor is connected to the second common terminal;
   a control transistor pair having at least one terminal pair connected to the common terminal pair, wherein the control transistor pair includes first and second control transistors, the first control transistor is connected to the first common terminal and the second control transistor is connected to the second common terminal;
   a current-mirror-load circuit having one terminal pair connected to the common terminal pair, wherein the terminal pair includes a reference current input terminal and a voltage output terminal, the reference current input terminal is connected to the first common terminal of the common terminal pair, and the voltage output terminal is connected to the second common terminal of the common terminal pair;
   a first feedback inverter having an input terminal and an output terminal, wherein the input terminal is connected to the second common terminal, and the output terminal is connected to the gate terminal of the first control transistor; and
   a second feedback inverter having an input terminal and an output terminal, wherein the input terminal is connected to the output terminal of the first feedback inverter, and the output terminal is connected to the gate terminal of the second control transistor;
   wherein the first feedback inverter and the second feedback inverter constitute a negative feedback with the control transistor pair.

2. The LVDS receiver circuit according to claim 1, further comprising an output inverter connected to the second feedback inverter.

3. The LVDS receiver circuit according to claim 1, wherein the drain-terminal pairs of the differential-input transistor pair and control transistor pair connect to the drain-terminal pair of the current-mirror-load circuit.

4. The LVDS receiver circuit according to claim 1, wherein the voltage of the second common terminal is controlled around the Threshold voltage of the first feedback inverter.

5. The L'VDS receiver circuit according to claim 1, further comprising a transistor connecting a first power to the other terminal pair of the differential-input transistor pair opposite the current-mirror-load circuit, wherein the transistor is turned off if a power-down mode is initiated.

6. The LVDS receiver circuit according to claim 5, further comprising a transistor connecting a second power to the other terminal pair of the control transistor pair opposite the current-mirror-load circuit wherein the transistor is turned off if a power-down mode is initiated, and the first power is not equal to the second power.

7. The LVDS receiver circuit according to claim 1, further comprising a transistor connecting the second common terminal to the grounding level, wherein the transistor is turned on if a power-down mode is initiated.

8. An LVDS receiver circuit, comprising:
   a common terminal pair having a first common terminal and a second common terminal;
   a differential-input transistor pair having a gate-terminal pair for receiving differential input voltage and one terminal pair connected to the common terminal pair, wherein the differential-input transistor pair includes first and second input transistors, the first input transistor is connected to the first common terminal and the second input transistor is connected to the second common terminal;
   a current-mirror-load circuit having one terminal pair connected to the common terminal pair, wherein the terminal pair includes a reference current input terminal and a voltage output terminal, the reference current input terminal is connected to the first common terminal of the common terminal pair, and the voltage output terminal is connected to the second common terminal of the common terminal pair;
   a first feedback inverter having an input terminal and an output terminal, wherein the input terminal is connected to the second common terminal; and
   a second feedback inverter having an input terminal and an output terminal, wherein the input terminal is connected to the output terminal of the first feedback inverter, and the output terminal connects to the first common terminal.

9. The LVDS receiver circuit according to claim 8, wherein the drain-terminal pair of the differential-input transistor pair connect to the drain-terminal pair of the current-mirror-load circuit.

10. The LVDS receiver circuit according to claim 8, wherein the voltage of the second common terminal is controlled around the threshold voltage of the first feedback inverter.

11. The LVDS receiver circuit according to claim 8, further comprising a first transistor connecting a power to the other terminal pair of the differential-input transistor pair opposite the current-mirror-load circuit and a second transistor connecting the second common terminal to the grounding level, wherein the first transistor is turned off and the second transistor is turned on if a power-down mode is initiated.

12. The LVDS receiver circuit according to claim 8, further comprising a buffer connected to the first feedback inverter.

13. An LVDS receiver circuit, comprising:
   a common terminal pair having a first common terminal and a second common terminal;

a differential-input transistor pair having a gate-terminal pair for receiving differential input voltage and one terminal pair connected to the common terminal pair, wherein the differential-input transistor pair includes first and second input transistors, the first input transistor is connected to the first common terminal and the second input transistor is connected to the second common terminal;

a current-mirror-load circuit having one terminal pair connected to the common terminal pair, wherein the terminal pair includes a reference current input terminal and a voltage output terminal, the reference current input terminal is connected to the first common terminal of the common terminal pair, and the voltage output terminal is connected to the second common terminal of the common terminal pair;

a feedback buffer having an input terminal and an output terminal, wherein the input terminal is connected to the second common terminal; and a feedback inverter having an input terminal and an output terminal, wherein the input terminal is connected to the output terminal of the feedback buffer, and the output terminal is connected to the second common terminal.

14. The LVDS receiver circuit according to claim 13, wherein the drain-terminal pair of the differential-input transistor pair connect to the drain-terminal pair of the current-mirror-load circuit.

15. The LVDS receiver circuit according to claim 13, wherein the voltage of the second common terminal is controlled around the threshold voltage of the feedback buffer.

16. The LVDS receiver circuit according to claim 13, further comprising a transistor connecting a first power to the other terminal pair of the differential-input transistor pair opposite the current-mirror-load circuit, wherein the transistor is turned off if a power-down mode is initiated.

17. The LVDS receiver circuit according to claim 13, further comprising a transistor connecting the second common terminal to the grounding level, wherein the transistor is turned on if a power-down mode is initiated.

18. An LVDS receiver circuit, comprising:
a common terminal pair having a first common terminal and a second common terminal;
a differential-input transistor pair having a gate-terminal pair for receiving differential input voltage and one terminal pair connected to the common terminal pair, wherein the differential-input transistor pair includes first and second input transistors, the first input transistor is connected to the first common terminal and the second input transistor is connected to the second common terminal;
a current-mirror-load circuit having one terminal pair connected to the common terminal pair, wherein the terminal pair includes a reference current input terminal and a voltage output terminal, the reference current input terminal is connected to the first common terminal of the common terminal pair, and the voltage output terminal is connected to the second common terminal of the common terminal pair;

means for amplifying the output voltage of the second common terminal; and
means for converting the amplified output voltage of the second common terminal to a current fed back on at least one terminal of the common terminal pair as a negative feedback.

19. The LVDS receiver circuit according to claim 18, wherein the drain-terminal pair of the differential-input transistor pair connect to the drain-terminal pair of the current-mirror-load circuit.

20. The LVDS receiver circuit according to claim 18, further comprising a first transistor connecting a power source to the other terminal pair of the differential-input transistor pair opposite the current-mirror-load circuit and a second transistor connecting the second common terminal to the grounding level, wherein the first transistor is turned off and the second transistor is turned on if a power-down mode is initiated.

21. An LVDS receiver circuit, comprising:
a common terminal pair having a first common terminal and a second common terminal;
an inverter pair for receiving differential input voltage having an output terminal pair connected to the common terminal pair, wherein the inverter pair includes first and second input inverters, the output of the first input inverter is connected to the first common terminal, and the output of the second input inverter is connected to the second common terminal;
a current-mirror circuit connected to the output terminal pair of the inverter pair, wherein the terminal pair includes a reference current input terminal and a voltage output terminal, the reference current input terminal is connected to the first common terminal of the common terminal pair, and the voltage output terminal is connected to the second common terminal of the common terminal pair;
a first buffer inverter connected to the second common terminal; and
a first feedback inverter having an input terminal connected to the output of the first buffer inverter and an output terminal connected to the first common terminal.

22. The LVDS receiver circuit according to claim 21, further comprising a second buffer inverter and a buffer, wherein the input of the second buffer inverter is connected to the output of the first buffer inverter, and the input of the buffer is connected to the output of the second buffer inverter.

23. The LVDS receiver circuit according to claim 21, further comprising transistors pulling up the inverter pair, the current-mirror circuit and the first feedback inverter to power, and a transistor pulling down the second common terminal to ground, wherein the pull-up transistors are turned off and the pull-down transistor is turned on if a power-down mode is initiated.

24. The LVDS receiver circuit according to claim 23, wherein the power supply connected to the inverter pair is different from tat connected to the current-mirror circuit and the first feedback inverter.

* * * * *